(12) United States Patent
Coolbaugh et al.

(10) Patent No.: US 7,479,439 B2
(45) Date of Patent: Jan. 20, 2009

(54) SEMICONDUCTOR-INSULATOR-SILICIDE CAPACITOR

(75) Inventors: Douglas D. Coolbaugh, Highland, NY (US); Zhong-Xiang He, Essex Junction, VT (US); Robert M. Rassel, Colchester, VT (US); Richard J. Rassel, Colchester, VT (US); Stephen A. St Onge, Colchester, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/737,844

(22) Filed: Apr. 20, 2007

(65) Prior Publication Data

US 2008/0258197 A1  Oct. 23, 2008

(51) Int. Cl.
*H01L 21/8244* (2006.01)
(52) U.S. Cl. ............... 438/393; 438/238; 438/239
(58) Field of Classification Search ............... None
See application file for complete search history.

(56) References Cited

U.S. PATENT DOCUMENTS

| | | | |
|---|---|---|---|
| 5,162,890 A * | 11/1992 | Butler | 257/306 |
| 6,511,873 B2 | 1/2003 | Ballantine et al. | |
| 6,638,816 B2 * | 10/2003 | Wakabayashi | 438/251 |
| 6,913,965 B2 | 7/2005 | Abadeer et al. | |
| 6,958,506 B2 | 10/2005 | Gousev et al. | |
| 2001/0052610 A1 * | 12/2001 | Leung et al. | 257/296 |
| 2003/0006480 A1 | 1/2003 | Lian et al. | |
| 2003/0073286 A1 | 4/2003 | Chiang et al. | |
| 2005/0139959 A1 | 6/2005 | Bernstein et al. | |
| 2006/0177981 A1 | 8/2006 | Hierlemann | |

\* cited by examiner

*Primary Examiner*—W. David Coleman
*Assistant Examiner*—Shaka Scarlett
(74) *Attorney, Agent, or Firm*—Scully, Scott, Murphy & Presser, P.C.; Richard M. Kotulak, Esq.

(57) ABSTRACT

A semiconductor-insulator-silicide (SIS) capacitor is formed by depositing a thin silicon containing layer on a salicide mask dielectric layer, followed by lithographic patterning of the stack and metallization of the thin silicon containing layer and other exposed semiconductor portions of a semiconductor substrate. The thin silicon containing layer is fully reacted during metallization and consequently converted to a silicide alloy layer, which is a first electrode of a capacitor. The salicide mask dielectric layer is the capacitor dielectric. The second electrode of the capacitor may be a doped polycrystalline silicon containing layer, a doped single crystalline semiconductor region, or another doped polycrystalline silicon containing layer disposed on the doped polycrystalline silicon containing layer. The SIS insulator may further comprise other dielectric layers and conductive layers to increase capacitance per area.

3 Claims, 11 Drawing Sheets

SEMICONDUCTOR-INSULATOR-SILICIDE CAPACITOR

FIELD OF THE INVENTION

The present invention relates to semiconductor structures, and particularly to semiconductor-insulator-silicide (SIS) capacitor structures and methods of manufacturing the same.

BACKGROUND OF THE INVENTION

Incorporation of passive components such as resistors and capacitors into conventional semiconductor circuitry enables analog and radio-frequency (RF) circuitry. While the manufacture of resistors in a semiconductor substrate involves only the formation of a patterned doped semiconductor area or a silicided area, and therefore is relatively straightforward to implement, manufacture of capacitors involves formation of a capacitor dielectric and two conductive plates on both sides of the capacitor dielectric, and therefore requires relatively involved processing steps.

In the prior art, deep trench capacitors are widely used in dynamic random access memory (DRAM) devices. While deep trenches offer high capacitance per area, formation of deep trench capacitors requires dedicated processing steps such as the formation of deep trenches by etching, formation of buried plates, filling of the inside of the deep trenches, and subsequent planarization. Similarly, stack capacitors are known in the prior art. To form stack capacitors, dedicated processing steps are used in the middle-of-line (MOL) level to form capacitors with high capacitance per area. Metal-insulator-metal capacitors (MIMCAPs) are also known in the prior art, in which metal levels are used as two plates of a capacitor structure and a dielectric layer is formed between the two plates within a BEOL wiring level. MIMCAPs require a low number of processing steps and less processing complexity compared with deep trench capacitors, while offering less capacitance per area. Further, gate dielectric based capacitors are known in the prior art, in which the gate dielectric is also utilized as a capacitor dielectric. While offering less processing complexity, gate dielectric based capacitors offer less capacitance per area as well as higher leakage current compared with deep trench capacitors since gate dielectrics typically have higher per area leakage current than dedicated capacitor dielectric under similar operating conditions. In addition, gate dielectric based capacitors typically have less conductive silicon bottom plates unless an additional ion implant is implemented to increase the conductivity of the bottom plate. These capacitors are typically non-linear.

In summary, prior art solutions for capacitors in semiconductor circuitry either have high leakage or require complex processing steps involving multiple mask levels. In other words, to form a low leakage capacitor in a semiconductor substrate according to the prior art, at least one and often times many mask levels are needed as well as many associated processing steps.

Therefore, there exists a need for a capacitor structure that offers low leakage current while requiring minimal processing complexity for manufacturing and methods of manufacturing the same Further, there exists a need for a capacitor structure that requires minimal incremental processing cost and minimal or no increase in the number of lithographic masks and methods of manufacturing the same.

SUMMARY OF THE INVENTION

The present invention addresses the needs described above by providing semiconductor capacitor structures that utilize a salicide (self-aligned-silicide) mask dielectric layer for a capacitor dielectric and methods for manufacturing the same.

Specifically, the present invention utilizes a thin silicon containing layer formed on top of an unpatterned salicide mask dielectric layer. After lithographic patterning of salicide regions, the structure according to the present invention comprises a patterned thin silicon containing layer disposed directly on a patterned salicide masking dielectric layer. During the silicidation process, the patterned silicon containing layer is converted into a silicide alloy layer. The patterned salicide mask dielectric layer serves as a capacitor dielectric and contacts are made to the underlying semiconductor structure and the overlying silicide alloy layer, which form the two electrodes of a semiconductor-insulator-silicide (SIS) capacitor.

According to a first embodiment of the present invention, a semiconductor structure comprises:

a silicide alloy layer located directly on a dielectric layer;

a doped polycrystalline silicon containing layer located beneath the dielectric layer; and a polysilicon silicide located directly on the doped polycrystalline silicon containing layer.

The dielectric layer is a salicide mask dielectric layer used for patterning a salicide, or a self-aligned silicide. According to the present invention, the dielectric layer, or the salicide mask dielectric layer, is also used to pattern the silicide alloy layer located directly on the dielectric layer.

Preferably, the semiconductor structure further comprises shallow trench isolation directly beneath the doped polycrystalline silicon containing layer. The dielectric layer is located directly on the doped polycrystalline silicon containing layer.

The semiconductor structure may also comprise a gate spacer on the doped polycrystalline silicon containing layer, wherein the gate spacer is topologically homeomorphic to a torus, i.e., the gate spacer may be transformed into a torus by continuous stretching and bending.

The dielectric layer may be located directly on the doped polycrystalline silicon containing layer. Alternatively, the semiconductor structure may further comprise an oxide layer, wherein the oxide layer is located directly on the doped polycrystalline silicon containing layer and directly beneath the dielectric layer. The silicide alloy layer may form a first electrode and the doped polycrystalline silicon containing layer may form a second electrode of a SIS capacitor.

In a variation of the first embodiment of the present invention, the semiconductor structure may further comprise:

another doped polycrystalline silicon containing layer located directly beneath the dielectric layer;

an insulating dielectric layer located directly beneath the another doped polycrystalline silicon containing layer and on the doped polycrystalline silicon containing layer; and another polysilicon silicide located directly on the another doped polycrystalline silicon containing layer.

The insulating dielectric layer may be located directly on the doped polycrystalline silicon containing layer. Alternatively, the semiconductor structure may further comprise an oxide layer, wherein the oxide layer is located directly on the doped polycrystalline silicon containing layer and directly beneath the insulating dielectric layer.

The silicide alloy layer and the polysilicon silicide may be electrically connected by a metallic conductive path to form a first electrode, while the another polysilicon silicide forms a second electrode of a capacitor.

According to a second embodiment of the present invention, a semiconductor structure comprises:

a silicide alloy layer located directly on a dielectric layer;

a doped single crystalline semiconductor region located beneath the dielectric layer; and a semiconductor silicide located directly on the doped single crystalline semiconductor region.

The doped single crystalline semiconductor region may be located directly beneath the dielectric layer. The silicide alloy layer may form a first electrode and the doped single crystalline semiconductor region may form a second electrode of a SIS capacitor.

Alternatively, the semiconductor structure according to the second embodiment of the present invention may further comprise:

a doped polycrystalline silicon containing layer located beneath the dielectric layer;

a gate dielectric located directly on the doped single crystalline semiconductor region and directly beneath the doped polycrystalline silicon containing layer; and a polysilicon silicide located directly on the doped polycrystalline silicon containing layer.

The semiconductor structure may also comprise a gate spacer on the doped polycrystalline silicon containing layer, wherein the gate spacer is topologically homeomorphic to a torus, i.e., the gate spacer may be transformed into a torus by continuous stretching and bending.

The dielectric layer may be located directly on the doped polycrystalline silicon containing layer. Alternatively, the semiconductor structure may further comprise an oxide layer, wherein the oxide layer is located directly on the doped polycrystalline silicon containing layer and directly beneath the dielectric layer. The silicide alloy layer and the semiconductor silicide may be electrically connected by a first metallic conductive path to form a first electrode, while the polysilicon silicide forms a second electrode of a capacitor.

In a variation of the second embodiment of the present invention, the semiconductor structure may further comprise:

another doped polycrystalline silicon containing layer located directly beneath the dielectric layer;

an insulating dielectric layer located directly beneath the another doped polycrystalline silicon containing layer and on the doped polycrystalline silicon containing layer; and another polysilicon silicide located directly on the another doped polycrystalline silicon containing layer.

The semiconductor structure may further comprise a first metallic conductive path that electrically connects the silicide alloy layer and the polysilicon silicide. Also, the semiconductor structure may further comprise a second metallic conductive path that electrically connects the another polysilicon silicide and the semiconductor silicide. If both the first and second metallic conductive paths are present, they are not electrically connected.

The semiconductor structure may further comprise an oxide layer, wherein the oxide layer is located directly beneath the another dielectric layer and directly on the doped polycrystalline silicon containing layer.

According to the first embodiment of the present invention, a method of manufacturing a semiconductor structure comprises:

forming a doped polycrystalline silicon containing layer on shallow trench isolation in a semiconductor substrate;

forming a patterned stack of a salicide mask dielectric layer and a thin silicon containing layer on the doped polycrystalline silicon containing layer;

metallizing the thin silicon containing layer to form a silicide alloy layer directly on the salicide mask dielectric layer; and forming a polysilicon silicide directly on the doped polycrystalline silicon containing layer.

Preferably, the silicide alloy layer and the polysilicon silicide are formed during the same processing steps.

The method according to the first embodiment of the present invention may further comprise:

forming an isolation dielectric layer on the doped polycrystalline silicon containing layer; and forming another doped polycrystalline silicon containing layer directly on the isolation dielectric layer and prior to forming the salicide mask dielectric layer.

The method may further comprise forming a metallic conductive path that electrically connects the silicide alloy layer and the polysilicon silicide. Also, the method may further comprise forming an oxide layer directly on the doped polycrystalline silicon containing layer and directly beneath the isolation dielectric layer. Furthermore, the method may comprise forming another polysilicon silicide directly on the another doped polycrystalline silicon containing layer.

According to the second embodiment of the present invention, a method of manufacturing a semiconductor comprises:

forming a doped single crystalline semiconductor region in a semiconductor substrate;

forming a patterned stack of a salicide mask dielectric layer and a thin silicon containing layer on the semiconductor substrate;

metallizing the thin silicon containing layer to form a silicide alloy layer directly on the salicide mask dielectric layer;

forming a semiconductor silicide directly on the doped single crystalline semiconductor region.

Preferably, the silicide alloy layer and the semiconductor silicide are formed during the same processing steps.

The method according to the second embodiment of the present invention may further comprise:

forming a gate dielectric directly on the doped single crystalline semiconductor region;

forming a first doped polycrystalline silicon containing layer directly on the gate dielectric prior to forming the salicide mask dielectric layer; and forming a first polysilicon silicide directly on the first doped polycrystalline silicon containing layer.

The method may comprise forming an oxide layer directly on the first doped polycrystalline silicon containing layer. Also, the method may comprise forming an oxide layer directly on the first doped polycrystalline silicon containing layer. Further, the method may comprise forming a metallic conductive path that electrically connects the silicide alloy layer and the semiconductor silicide.

According to the second embodiment of the present invention, the method may further comprise:

forming an isolation dielectric layer on the first doped polycrystalline silicon containing layer;

forming a second doped polycrystalline silicon containing layer directly on the isolation dielectric layer prior to forming the salicide mask dielectric layer; and forming a second polysilicon silicide directly on the second doped polycrystalline silicon containing layer.

The method may comprise forming the isolation dielectric layer directly on the first doped polycrystalline silicon containing layer. Alternatively, the method may comprise forming an oxide layer directly on the first doped polycrystalline silicon containing layer.

The method may further comprise forming a first metallic conductive path that electrically connects the silicide alloy layer and the first polysilicon silicide. Also, the method may further comprise forming a second metallic conductive path that electrically connects the semiconductor silicide and the second polysilicon silicide. If both the first and second metallic conductive paths are formed, the first metallic conductive path and the second metallic conductive path are not electrically connected.

DETAILED DESCRIPTION OF THE INVENTION

Figure 1:
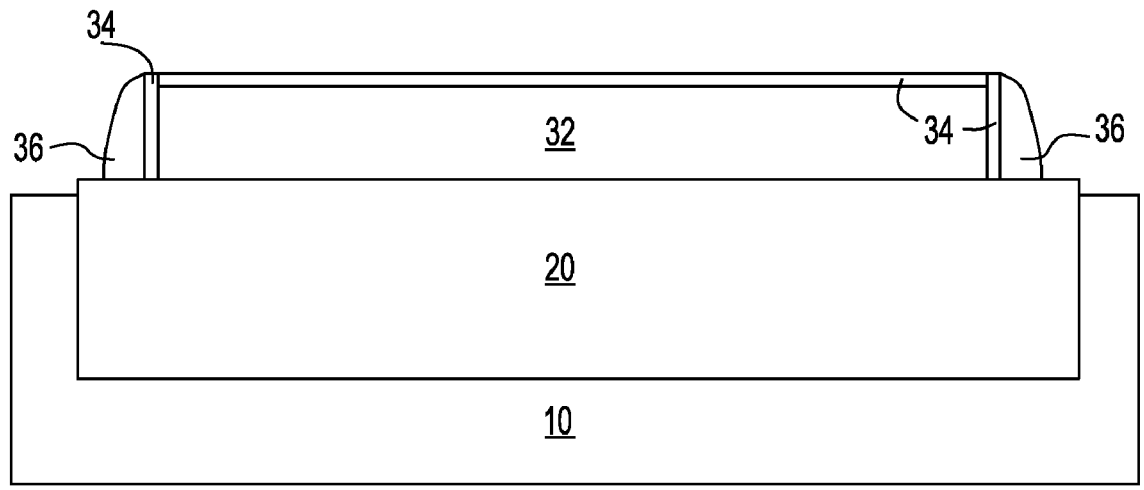
FIGS. 1-7 are sequential vertical cross-sectional views of a first exemplary structure according to the first embodiment of the present invention.

As stated above, the present invention relates to semiconductor-insulator-silicide (SIS) capacitor structures and methods of manufacturing the same, which are now described in detail with accompanying figures. It is noted that like and corresponding elements are referred to by like reference numerals.

Referring to FIG. 1, a first exemplary semiconductor structure according to a first embodiment of the present invention comprises shallow trench isolation 20 formed in a semiconductor substrate 10, a first doped polycrystalline silicon containing layer 32 disposed directly on the shallow trench isolation 20, an optional oxide layer 34 formed directly on the first doped polycrystalline silicon containing layer 32, and a gate spacer 36 disposed on the doped polycrystalline silicon containing layer 32. The gate spacer 36 is disposed directly on the optional oxide layer 34, if present, or disposed directly on the polycrystalline silicon containing layer 32 if an optional oxide layer is not present. Preferably, the first doped polycrystalline silicon containing layer 32 is of unitary construction, i.e., in one piece. The gate spacer 36 surrounds the first doped polycrystalline silicon containing layer 32 and is topologically homeomorphic to a torus, i.e., the gate spacer 36 may be transformed into a torus by continuous stretching and bending.

The semiconductor substrate 10 may comprise a semiconductor material selected from the group consisting of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The shallow trench isolation 20 comprises a dielectric material such as silicon oxide. The method of forming the shallow trench isolation 20 in the semiconductor substrate 10 is well known in the art.

The first doped polycrystalline silicon containing layer 32 is a doped polycrystalline material that contains silicon and may comprise doped polysilicon, doped polycrystalline silicon-germanium alloy, doped polycrystalline silicon-carbon alloy, or doped polycrystalline silicon-germanium-carbon alloy. The first doped polycrystalline silicon containing layer 32 may be doped with p-type dopants such as boron and gallium, or may be doped with n-type dopants such as phosphorus, arsenic, and antimony. Preferably, at least one gate conductor of at least one metal-oxide-semiconductor field effect transistor (MOSFET; not shown) is formed on the same semiconductor substrate 10 as the first doped polycrystalline silicon containing layer 32. More preferably, the at least one gate conductor and the first doped polycrystalline silicon containing layer 32 are formed during the same processing steps and comprise the same material.

The optional oxide layer 34 may or may not be employed in exemplary structures according to the first embodiment of the present invention. In the first exemplary structure shown in FIGS. 1-7, an optional oxide layer 34 is formed directly on the first doped polycrystalline silicon containing layer 32 by deposition or by oxidation of an outer portion of the first doped polycrystalline silicon containing layer 32. The optional oxide layer 34 is formed on the surfaces of the first doped polycrystalline silicon containing layer 32 that does not contact the shallow trench isolation 20. Preferably, the optional oxide layer 34 comprises the same material as an oxide spacer of the at least one MOSFET, and is formed during the same processing steps as the oxide spacer of the at least one MOSFET. The thickness of the optional oxide layer 34 is in the range from about 1 nm to about 15 nm, and preferably in the range from about 3 nm to about 8 nm. The gate spacer 36 is formed on the optional oxide layer 34, preferably with the same material and during the same processing steps as gate spacers for the at least one MOSFET. The gate spacer 36 comprises a dielectric material such as silicon nitride, silicon oxide, silicon oxynitride, and low-k dielectric material.

Figure 2:
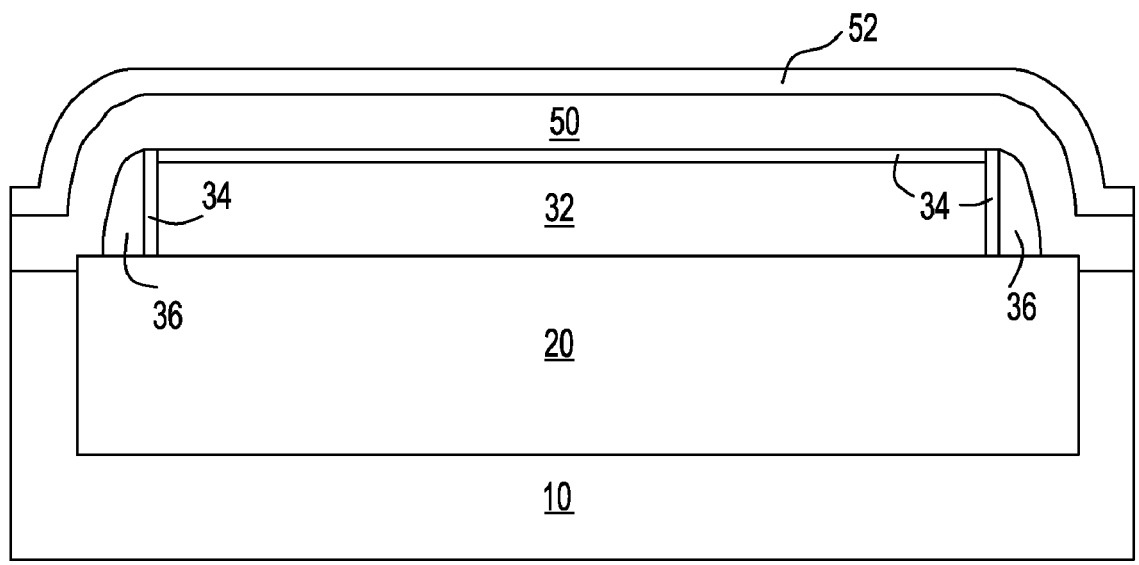

Referring to FIG. 2, a stack of a salicide mask dielectric layer 50 and a thin silicon containing layer 52 is deposited on the first doped polycrystalline silicon containing layer 32. Specifically, the salicide mask dielectric layer 50 is deposited by a blanket deposition directly on the optional oxide layer 34. The salicide mask dielectric layer 50 is a dielectric layer that prevents formation of silicide from the semiconductor material located directly beneath during a salicide (self-aligned silicide) formation process, in which a metal disposed directly on an exposed portion of a semiconductor material is reacted to form a self-aligned silicide while masked portions of the semiconductor material does not form a silicide. The salicide mask dielectric layer 50 may be silicon oxide, silicon nitride, silicon oxynitride, or a stack thereof. Preferably, the salicide mask dielectric layer 50 is silicon nitride. Preferably, the salicide mask dielectric layer 50 has a thickness in the range from about 10 nm to about 100 nm, and more preferably, has a thickness in the range from about 30 nm to about 70 nm.

A thin silicon containing layer 52 is thereafter deposited directly on the salicide mask dielectric layer 50. The thin silicon containing layer 52 comprises a silicon containing material. Non-limiting examples of the silicon containing material include amorphous silicon, amorphous silicon-germanium alloy, amorphous silicon-carbon alloy, amorphous silicon-germanium-carbon alloy, polysilicon, polycrystalline silicon-germanium alloy, polycrystalline silicon-carbon alloy, and polycrystalline silicon-germanium-carbon alloy. The thin silicon containing layer 52 may be undoped or doped with boron, gallium, phosphorus, arsenic, or antimony. The thin silicon containing layer 52 may be deposited by conventional deposition methods such as low pressure chemical vapor deposition (LPCVD), plasma-enhanced chemical vapor deposition (PECVD), atomic layer deposition (ALD), and physical vapor deposition (PVD), e.g., sputtering. The thickness of the silicon containing layer 50 is determined such that the entire thin silicon containing layer 52 is silicided during a subsequent silicidation process and does not leave any unreacted material above the salicide mask dielectric layer 50 after the silicidation process. Due to such a constraint on the thickness, the silicon containing layer has a thickness in the range from about 5 nm to about 50 nm, and preferably from about 10 nm to about 30 nm. The silicon containing layer 50 may be deposited at the target thickness, or alternatively, may be deposited with a thicker thickness followed by an etch-back of some of the deposited material either by a wet etch or by a reactive ion etch (RIE).

Figure 3:
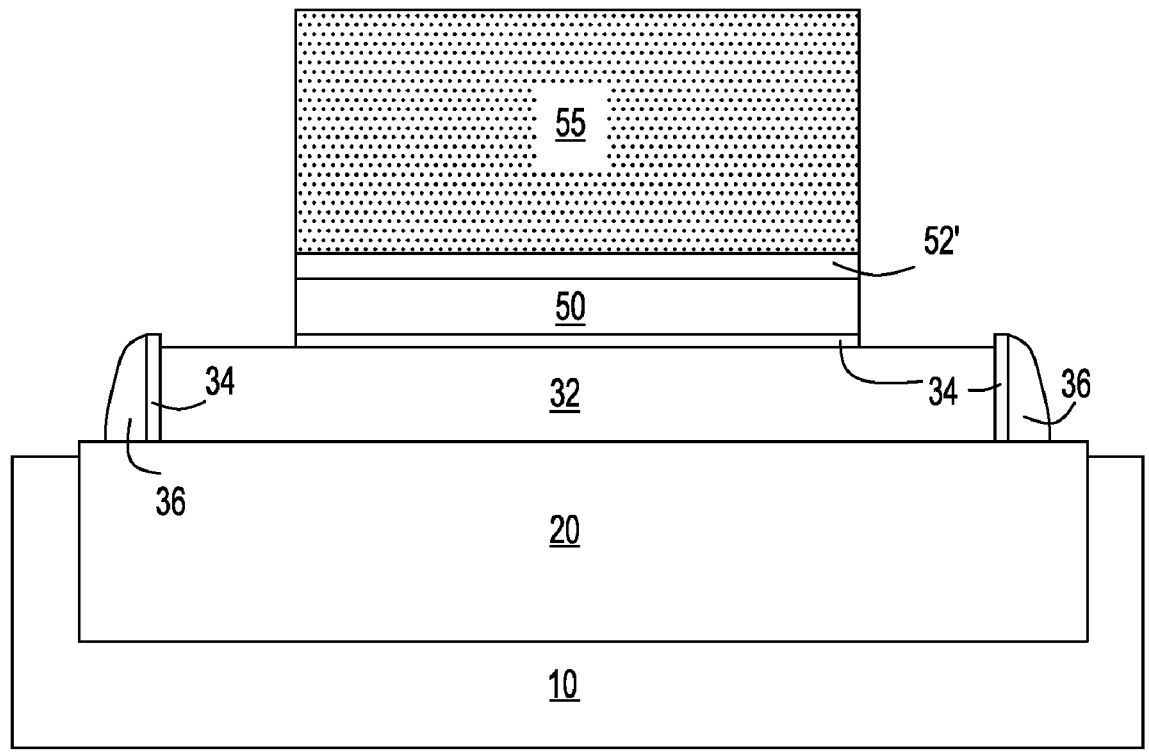

Referring to FIG. 3, a photoresist 55 is applied to the top surface of the thin silicon containing layer 52 and lithographically patterned such that a portion of the thin silicon containing layer 52 that corresponds to a capacitor structure to be subsequently formed is covered with the photoresist 55 after the lithographic patterning. During the manufacture of the first exemplary structure according to the first embodiment of the present invention, the photoresist 55 covers a portion of the thin silicon containing layer 52 on top of a portion of the first doped polycrystalline silicon containing layer 32, while another portion of the first doped polycrystalline silicon containing layer 32 is not covered by the photoresist 55. Once the photoresist 55 is patterned, the pattern is transferred into the thin silicon containing layer 52, the salicide mask dielectric layer 50, and the optional oxide layer 34. After the pattern transfer, a patterned thin silicon containing layer 52' is present underneath the patterned photoresist 55 and the portion of the first doped polycrystalline silicon containing layer 32 that is not covered with the patterned photoresist 55 is exposed.

Figure 4:
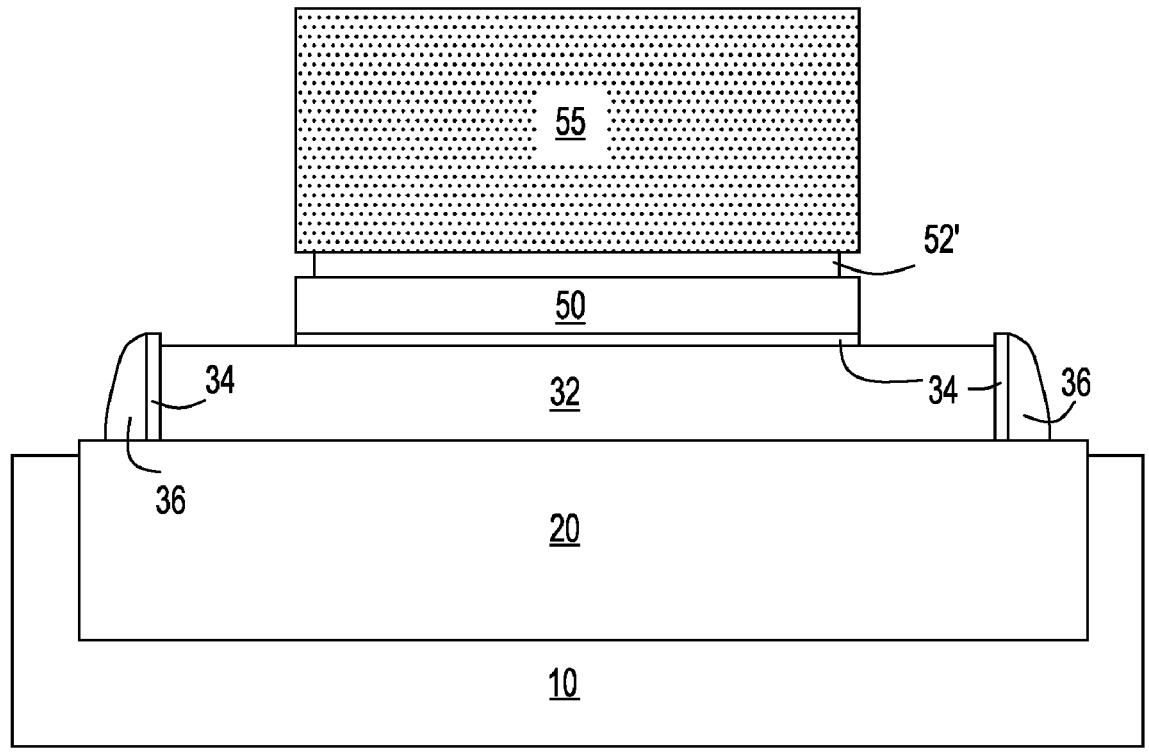

Referring to FIG. 4, the patterned thin silicon containing layer 52' may optionally be laterally recessed so that the silicide subsequently to be formed out of the patterned thin silicon containing layer 52' is resistant to formation of a structure that may cause an electrical short to a silicide to be formed directly on the first doped polycrystalline silicon layer 32. Mechanisms that may cause an electrical short between adjacent silicide structures include silicide stringers and silicide creep along the salicide mask dielectric layer 50. The lateral recessing of the patterned thin silicon containing layer 52' may be performed at any stage after the vertical etching of the patterned thin silicon containing layer 52' and prior to removal of the patterned photoresist 55.

Figure 5:
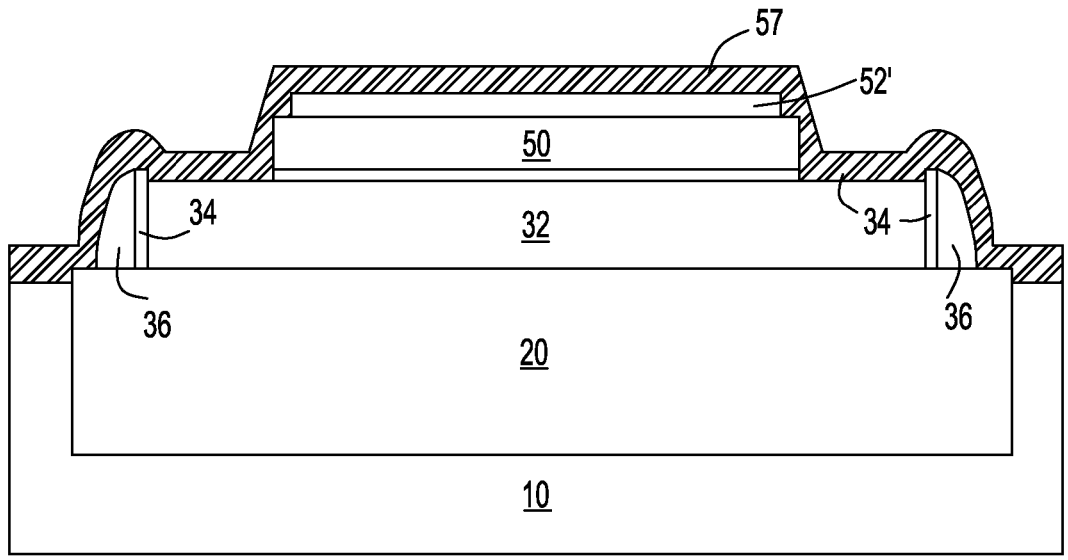

Referring to FIG. 5, the patterned photoresist 55 is subsequently removed. A metal layer 57 is deposited on the patterned thin silicon containing layer 52' and on the exposed portion of the first doped polycrystalline silicon containing layer 32. The metal layer 57 is a silicide forming metal such as titanium, tantalum, tungsten, cobalt, nickel, platinum, other refractory metal, or an alloy thereof.

Figure 6:
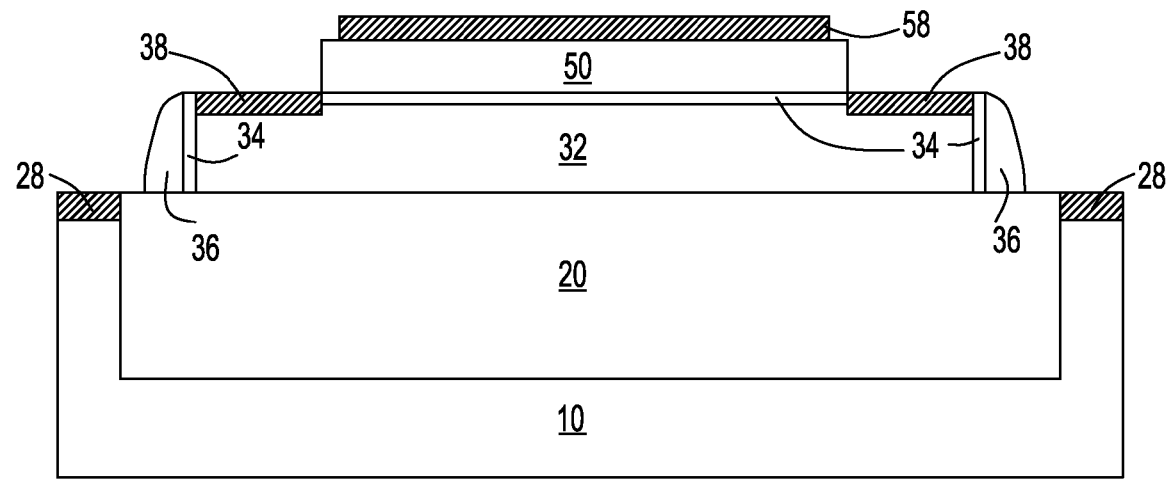

Referring to FIG. 6, the metal layer 57 is reacted with underlying semiconductor material wherever a semiconductor material is present directly beneath the metal layer 57 during at least one silicidation anneal. Multiple silicidation anneals with different anneal temperatures or durations may be employed to optimize the properties of the resulting silicides or silicide alloys. A semiconductor silicide 28 is formed directly on the semiconductor substrate 10. A first polysilicon silicide 38 is formed directly on the first doped polycrystalline silicon containing layer 32 by the reaction of a portion of the first doped polycrystalline silicon containing layer 32 with the metal layer 57.

All the semiconductor material in the patterned thin silicon containing layer 52' is reacted with the metal layer 57 to form a silicide alloy layer 58. The silicide alloy layer 58 is located directly on the salicide mask dielectric layer 50. The composition of the silicide alloy layer 58 depends on the composition of the patterned thin silicon containing layer 52'. The silicide alloy layer 58 may comprise metal silicide, metal silicide-metal germanide alloy, metal silicide-metal carbide alloy, or metal silicide-metal germanide-metal carbide alloy. The silicide alloy layer 58 may further comprise electrical dopants such as boron, gallium, phosphorus, arsenic, or antimony.

It is explicitly contemplated herein, however, that an unreacted silicon layer may be formed between the metal silicide alloy layer 58 directly contacts the underlying salicide mask dielectric layer 50. Such a structure may be formed by increasing the thickness of the thin silicon containing layer 52 so that silicidation process does not fully consume the thin silicon containing layer 52.

Figure 7:
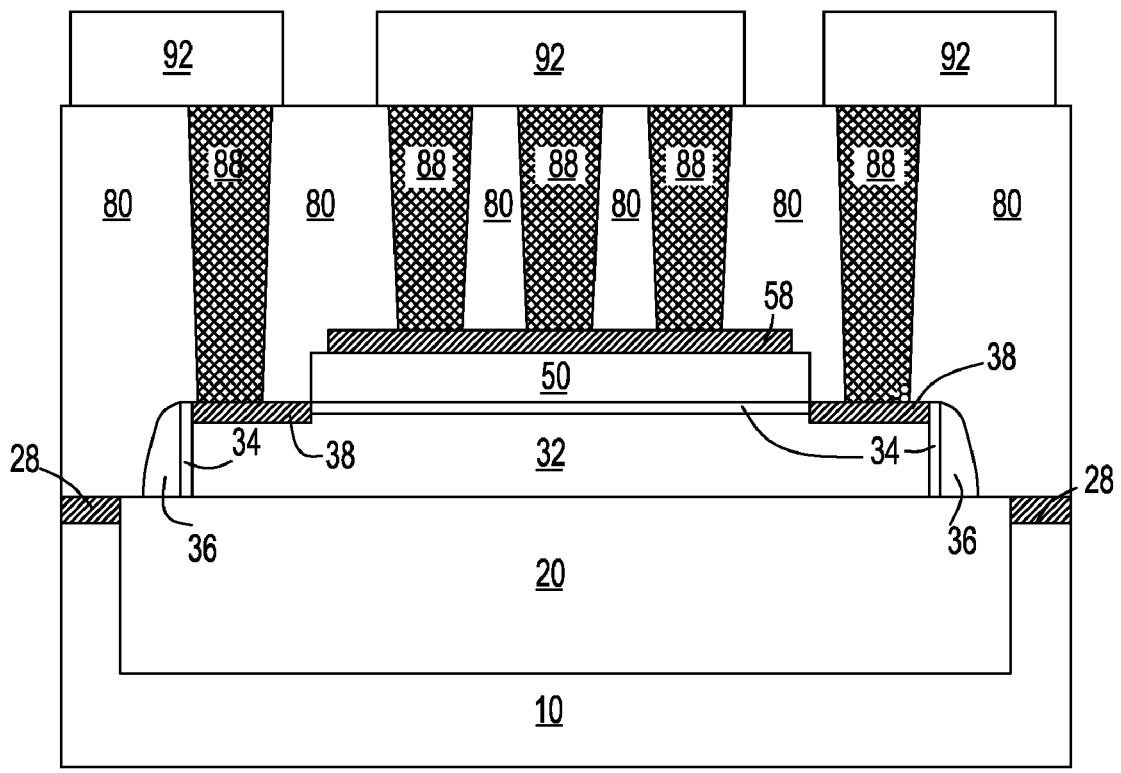

Referring to FIG. 7, a middle-of-line (MOL) dielectric 80 is formed over the semiconductor substrate 10. Contact via holes are formed in the MOL dielectric 80 and contact vias 88 are formed within the contact via holes by deposition of a metal followed by planarization. At least one wiring level metal 92 is deposited and patterned as well as corresponding at least one wiring level dielectric layers (not shown).

In the first exemplary structure according to the first embodiment of the present invention, the silicide alloy layer 58 comprises a first electrode of a semiconductor-insulator-silicide (SIS) capacitor, the first doped polycrystalline silicon containing layer 32 comprises a second electrode of the SIS capacitor, and the stack of the salicide mask dielectric layer 50 and the optional oxide layer 34 comprise a capacitor dielectric of the SIS capacitor.

Figure 8:
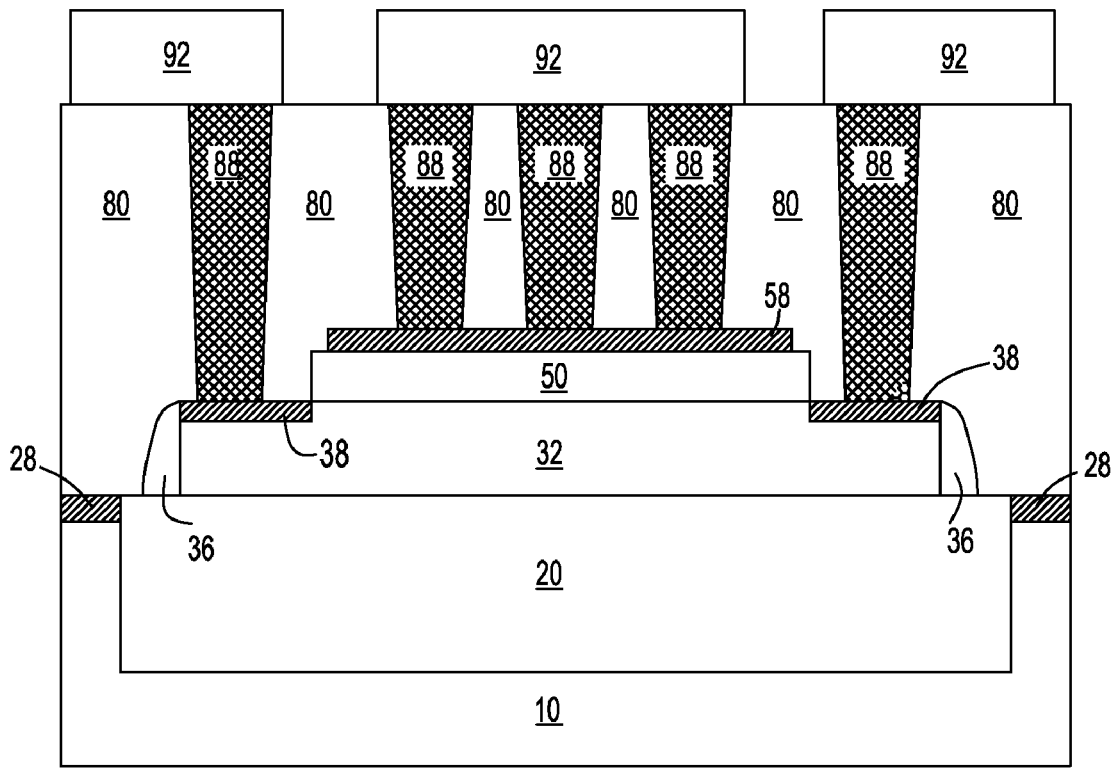
FIGS. 8-10 are vertical cross-sectional views of a second, a third, and a fourth exemplary structure, respectively, according to the first embodiment of the present invention.

Referring to FIG. 8, a second exemplary semiconductor structure according to the first embodiment of the present invention is shown. The second exemplary semiconductor structure does not contain the optional oxide layer 34 of the first exemplary semiconductor structure. The manufacturing methods of the second exemplary structure are identical to those of the first exemplary structure except that the optional oxide layer 34 is not formed. Consequently, the gate spacer 36 directly contacts the first doped polycrystalline silicon containing layer 32. Similarly, the salicide mask dielectric layer 50 is formed directly on the first doped polycrystalline silicon containing layer 32. The capacitor dielectric of the SIS capacitor in the second exemplary structure consists of the salicide mask dielectric layer 50, and does not contain the optional oxide layer 34.

Figure 9:
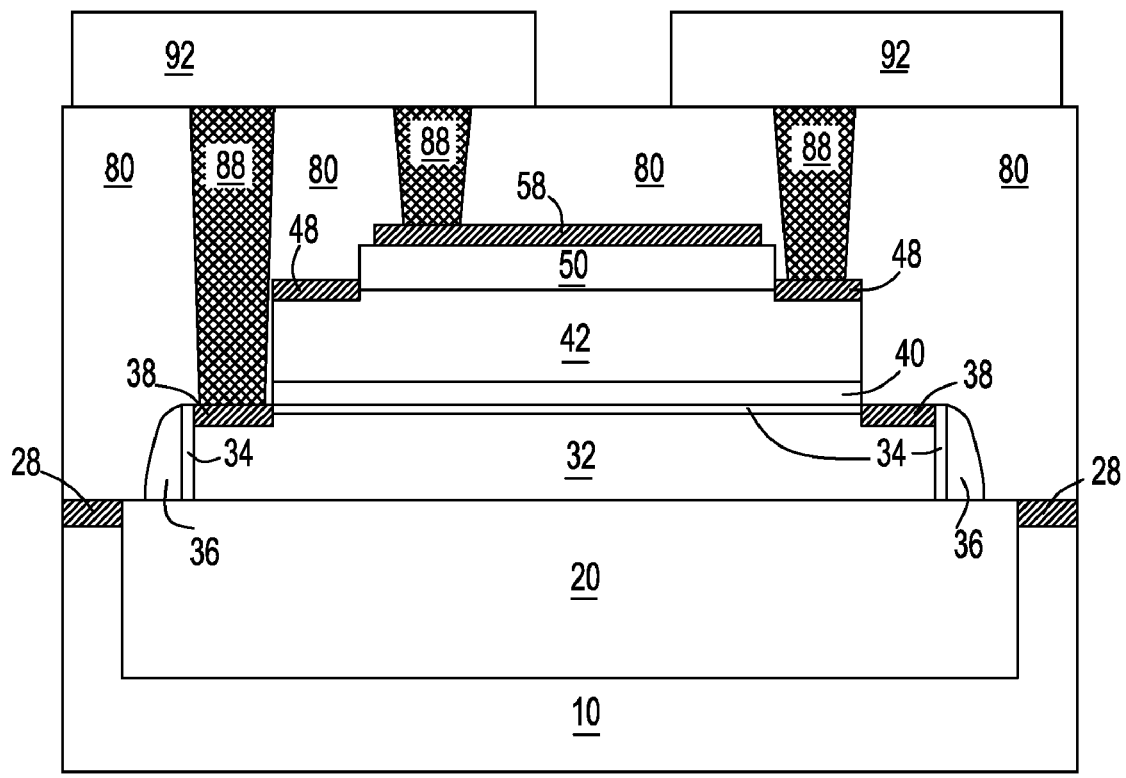

Referring to FIG. 9, a third exemplary structure according to the first embodiment of the present invention is shown. In addition to the components of the first exemplary structure, the third exemplary structure further comprises an insulting dielectric layer 40 formed directly on a horizontal portion of the optional oxide layer 34 and a second doped polycrystalline silicon containing layer 42 formed directly on the insulating dielectric layer 40. The stack of the insulating dielectric layer 40 and the second doped polycrystalline silicon containing layer 42 are formed and patterned prior to deposition of the salicide mask dielectric layer 50. The lithographic patterning of the stack of the insulating dielectric layer 40 and the second doped polycrystalline silicon containing layer 42 exposes a portion of the first doped polycrystalline silicon layer 34 such that a first polysilicon silicide 38 may be subsequently formed.

The insulating dielectric layer 42 may comprise silicon oxide, silicon nitride, silicon oxynitride, or a stack thereof. Preferably, the insulating dielectric layer 42 comprises the same material as a base dielectric of a bipolar transistor (not shown) and formed during the same processing steps as the base dielectric of the bipolar transistor. The base dielectric is a dielectric layer that is formed prior to the formation of an intrinsic base or extrinsic base in a bipolar transistor manufacturing process.

The second doped polycrystalline silicon containing layer 42 is a doped polycrystalline material that contains silicon and may comprise doped polysilicon, doped polycrystalline silicon-germanium alloy, doped polycrystalline silicon-carbon alloy, or doped polycrystalline silicon-germanium-carbon alloy. The second doped polycrystalline silicon containing layer 42 may be doped with p-type dopants such as boron and gallium, or may be doped with n-type dopants such as phosphorus, arsenic, and antimony. Preferably, the second doped polycrystalline silicon containing layer 42 comprises the same material as an intrinsic base, an extrinsic base, or a stack of an intrinsic base and an extrinsic base of a bipolar transistor (not shown) and formed during the same processing steps as the corresponding component the bipolar transistor.

During the manufacture of the third exemplary structure according to the first embodiment of the present invention, the thin silicon containing layer 52 is formed directly on the second doped polycrystalline silicon containing layer 42. Thereafter, a photoresist 55 is applied to the top surface of the thin silicon containing layer 52 and lithographically patterned. The photoresist 55 covers a portion of the thin silicon containing layer 52 on top of a portion of the second doped polycrystalline silicon containing layer 42 while another portion of the second doped polycrystalline silicon containing layer 42 is not covered by the photoresist 55. Once the photoresist 55 is patterned, the pattern is transferred into the thin silicon containing layer 52 and the salicide mask dielectric layer 50. After the pattern transfer, a patterned thin silicon containing layer 52' is present underneath the patterned photoresist 55 and the portion of the second doped polycrystalline silicon containing layer 42 that is not covered with the patterned photoresist 55 is exposed.

During the formation of silicides, a second polysilicon silicide 48 is formed directly on the second doped polycrystalline silicon containing layer 42 in addition to the silicides of the first exemplary structure, i.e., a semiconductor silicide 28 formed directly on the semiconductor substrate 10, a first polysilicon silicide 38 formed directly on the first doped polycrystalline silicon containing layer 32, and a silicide alloy layer 58 formed from the semiconductor material in the patterned thin silicon containing layer 52'.

In the third exemplary structure according to the first embodiment of the present invention, the silicide alloy layer 58 comprises a first electrode of a semiconductor-insulator-silicide (SIS) capacitor, the second doped polycrystalline silicon containing layer 42 comprises a second electrode of the SIS capacitor, and the first doped polycrystalline silicon containing layer 32 comprises a third electrode of the SIS capacitor. The salicide mask dielectric layer 50 comprises a first capacitor dielectric between the first electrode and the second electrode of the SIS capacitor. The stack of the insulating dielectric layer 40 and the optional oxide layer 34 comprises the second capacitor dielectric between the second electrode and the third electrode of the SIS capacitor. Optionally, the first electrode and the third electrode may be connected by a metallic conductive path, which comprises two contact vias 88 and a wiring level metal 92 in FIG. 9.

The other components of the third exemplary structure that are common with the first exemplary structure are formed by the same methods for manufacturing the first exemplary structure according to the first embodiment of the present invention. Other alterations in the methods of manufacturing the first and the third exemplary structures are known to a person of ordinary skill in the art.

Figure 10:
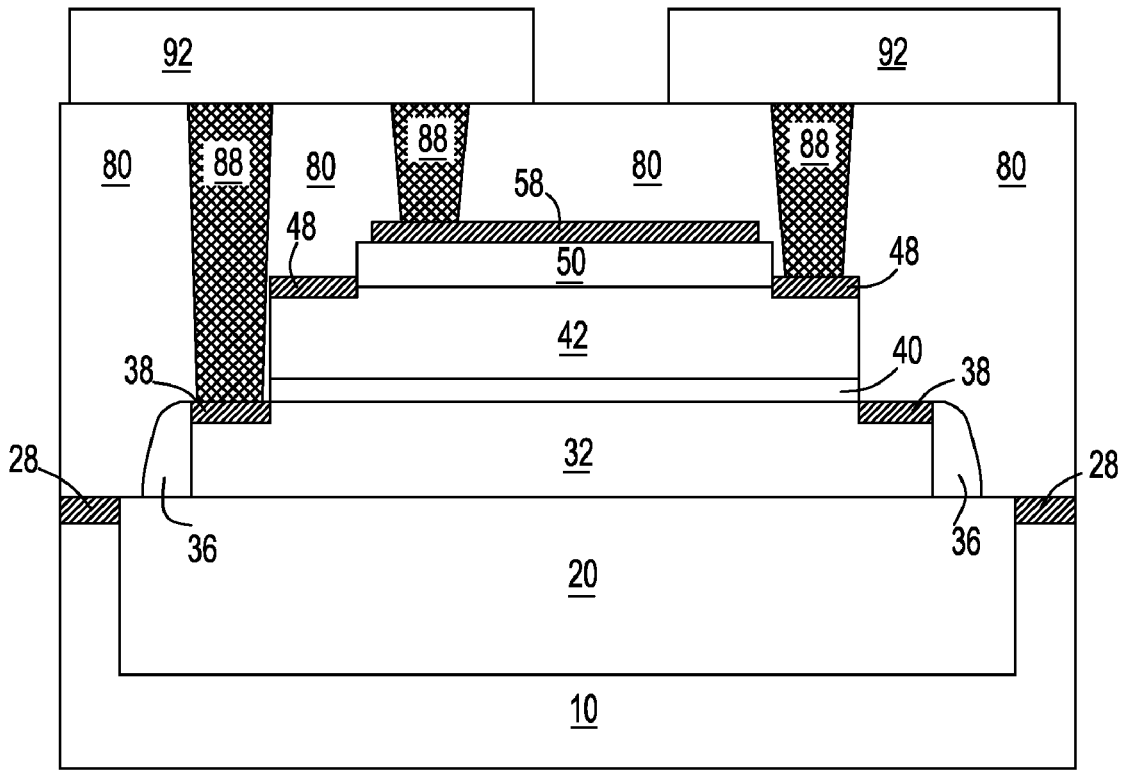

Referring to FIG. 10, a fourth exemplary semiconductor structure according to the first embodiment of the present invention is shown. The fourth exemplary semiconductor structure does not contain the optional oxide layer 34 of the third exemplary semiconductor structure. The manufacturing methods of the fourth exemplary structure are identical to those of the third exemplary structure except that the optional oxide layer 34 is not formed. Consequently, the gate spacer 36 directly contacts the first doped polycrystalline silicon containing layer 32. Similarly, the insulating dielectric layer 40 is formed directly on the first doped polycrystalline silicon containing layer 32. The second capacitor dielectric of the SIS capacitor in the fourth exemplary structure consists of the insulting dielectric layer 40 and does not contain the optional oxide layer 34.

Figure 11:
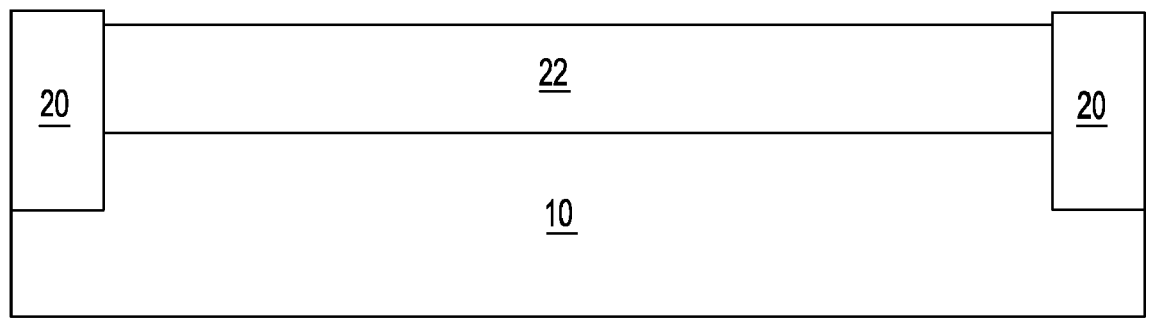
FIGS. 11-17 are sequential vertical cross-sectional views of a fifth exemplary structure according to the second embodiment of the present invention.

Referring to FIG. 11, a vertical cross-sectional view of a fifth exemplary semiconductor structure according to a second embodiment of the present invention comprises, a doped single crystalline semiconductor region 22 in a semiconductor substrate 10. Shallow trench isolation 20 formed within the semiconductor substrate 10 is also shown.

The semiconductor substrate 10 may comprise a semiconductor material selected from the group consisting of silicon, germanium, silicon-germanium alloy, silicon carbon alloy, silicon-germanium-carbon alloy, gallium arsenide, indium arsenide, indium phosphide, III-V compound semiconductor materials, II-VI compound semiconductor materials, organic semiconductor materials, and other compound semiconductor materials. The shallow trench isolation 20 comprises a dielectric material such as silicon oxide. The method of forming the shallow trench isolation 20 in the semiconductor substrate 10 is well known in the art. The doped single crystalline semiconductor region 22 is formed by diffusing or implanting dopants into the semiconductor substrate. The doped single crystalline semiconductor region 22 may be doped with p-type dopants such as boron and gallium, or may be doped with n-type dopants such as phosphorus, arsenic, and antimony.

Figure 12:
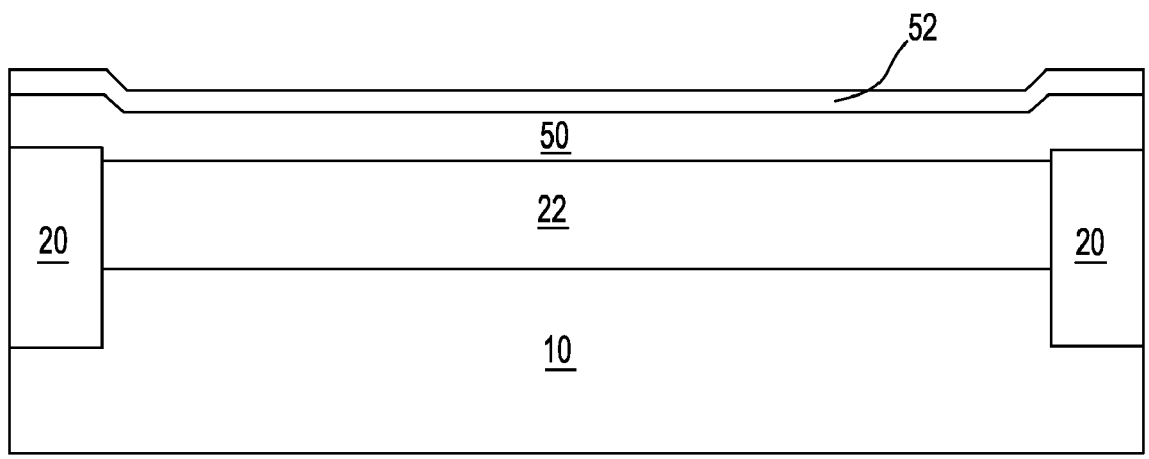

Referring to FIG. 12, a stack of a salicide mask dielectric layer 50 and a thin silicon containing layer 52 is deposited on the doped single crystalline semiconductor region 22. In the fifth structure according to the second embodiment of the present invention, the salicide mask dielectric layer 50 is deposited by a blanket deposition directly on the doped single crystalline semiconductor region 22. The salicide mask dielectric layer 50 is a dielectric layer that prevents formation of silicide from the semiconductor material located directly beneath during a salicide (self-aligned silicide) formation process, in which a metal disposed directly on an exposed portion of a semiconductor material is reacted to form a self-aligned silicide while masked portions of the semiconductor material does not form a silicide. The salicide mask dielectric layer 50 may be a silicon oxide, a silicon nitride, a silicon oxynitride, or a stack thereof. Preferably, the salicide mask dielectric layer 50 is a silicon nitride. Preferably, the salicide mask dielectric layer 50 has a thickness in the range from about 10 nm to about 100 nm, and more preferably, has a thickness in the range from about 30 nm to about 70 nm.

A thin silicon containing layer 52 is thereafter deposited directly on the salicide mask dielectric layer 50. The properties of the thin silicon containing layer 52 and methods of manufacturing the thin silicon containing layer 52 according to the second embodiment of the present invention are the same as those according to the first embodiment of the present invention.

Figure 13:
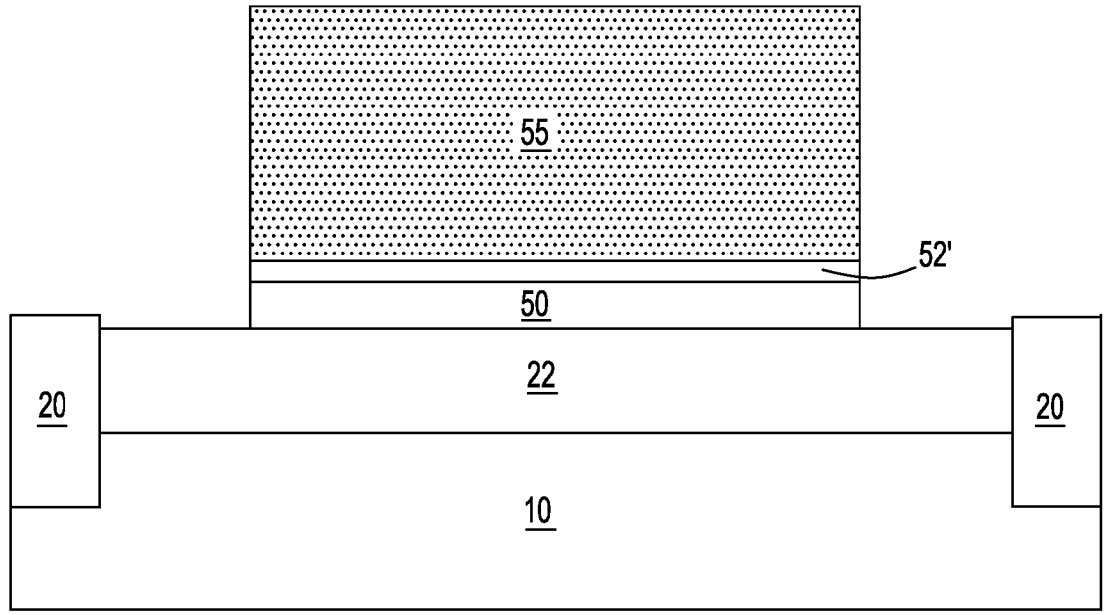

Referring to FIG. 13, a photoresist 55 is applied to the top surface of the thin silicon containing layer 52 and lithographically patterned such that a portion of the thin silicon containing layer 52 that corresponds to a capacitor structure be subsequently formed is covered with the photoresist 55 after the lithographic patterning. During the manufacture of the fifth exemplary structure according to the second embodiment of the present invention, the photoresist 55 covers a portion of the thin silicon containing layer 52 on top of a portion of the doped single crystalline semiconductor region 22 while another portion of the doped single crystalline semiconductor region 22 is not covered by the photoresist 55. Once the photoresist 55 is patterned, the pattern is transferred into the thin silicon containing layer 52 and the salicide mask dielectric layer 50. After the pattern transfer, a patterned thin silicon containing layer 52' is present underneath the patterned photoresist 55 and the portion of the doped single crystalline semiconductor region 22 that is not covered with the patterned photoresist 55 is exposed.

Figure 14:
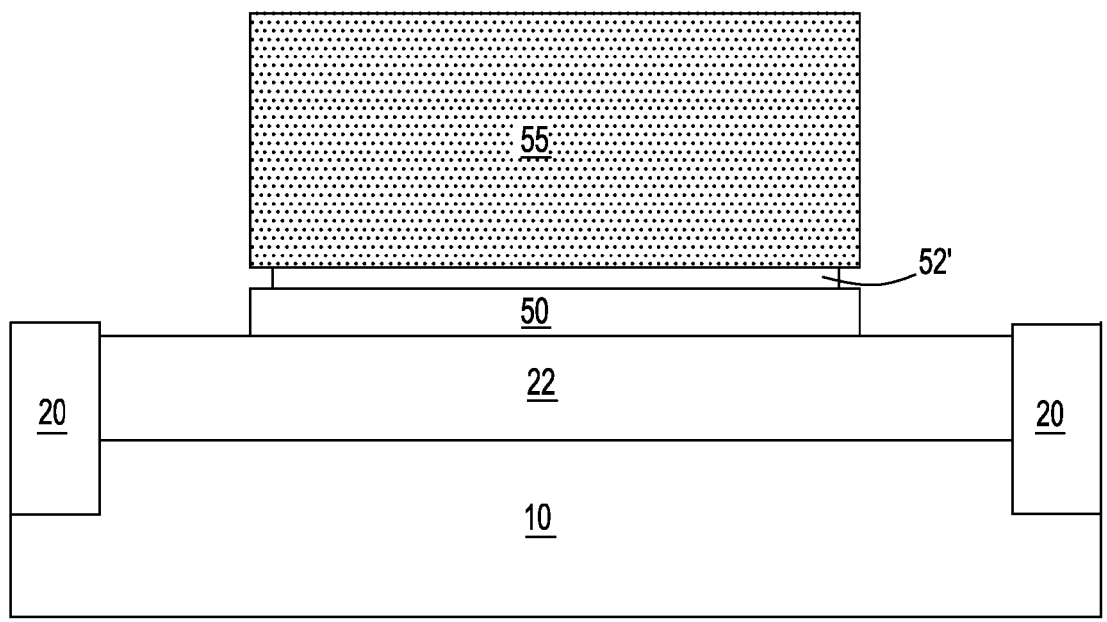

Referring to FIG. 14, the patterned thin silicon containing layer 52' may optionally be laterally recessed so that the silicide subsequently to be formed out of the patterned thin silicon containing layer 52' is resistant to formation of a structure that may cause an electrical short to a silicide to be formed on the first doped polycrystalline silicon layer 32. Mechanisms that may cause an electrical short between adjacent silicide structures include silicide stringers or silicide creep along the salicide mask dielectric layer 50. The lateral recessing of the patterned thin silicon containing layer 52' may be performed at any stage after the vertical etching of the patterned thin silicon containing layer 52' and prior to removal of the patterned photoresist 55.

Figure 15:
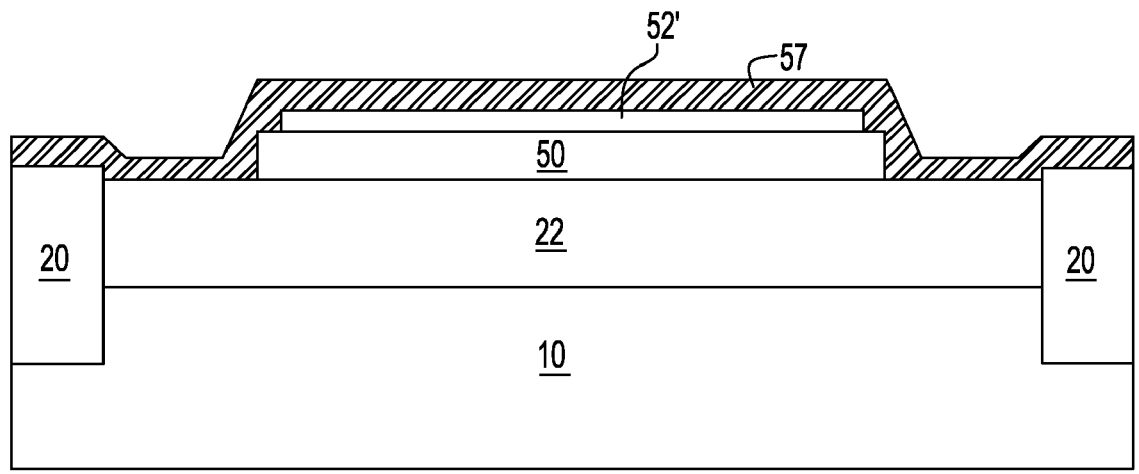

Referring to FIG. 15, the patterned photoresist 55 is subsequently removed. A metal layer 57 is deposited on the patterned thin silicon containing layer 52' and on the exposed portion of the doped single crystalline semiconductor region 22. The metal layer 57 is a silicide forming metal such as titanium, tantalum, tungsten, cobalt, nickel, platinum, other refractory metal, or an alloy thereof.

Figure 16:
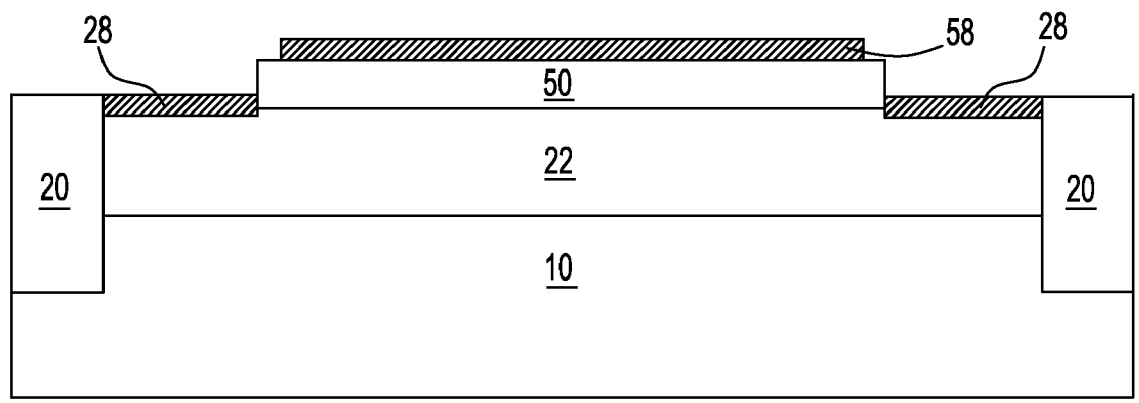

Referring to FIG. 16, the metal layer 57 is reacted with underlying semiconductor material wherever a semiconductor material is present directly beneath the metal layer 57 during at least one silicidation anneal. Multiple silicidation anneals with different anneal temperatures or durations may be employed to optimize the properties of the resulting silicides or silicide alloys. A semiconductor silicide 28 is formed directly on the doped single crystalline semiconductor region 22. All the semiconductor material in the patterned thin silicon containing layer 52' is reacted with the metal layer 57 to form a silicide alloy layer 58. The silicide alloy layer 58 is located directly on the salicide mask dielectric layer 50. The composition of the silicide alloy layer 58 depends on the composition of the patterned thin silicon containing layer 52'. The silicide alloy layer 58 may comprise metal silicide, metal silicide-metal germanide alloy, metal silicide-metal carbide alloy, or metal silicide-metal germanide-metal carbide alloy. The silicide alloy layer 58 may further comprise electrical dopants such as boron, gallium, phosphorus, arsenic, or antimony.

Figure 17:
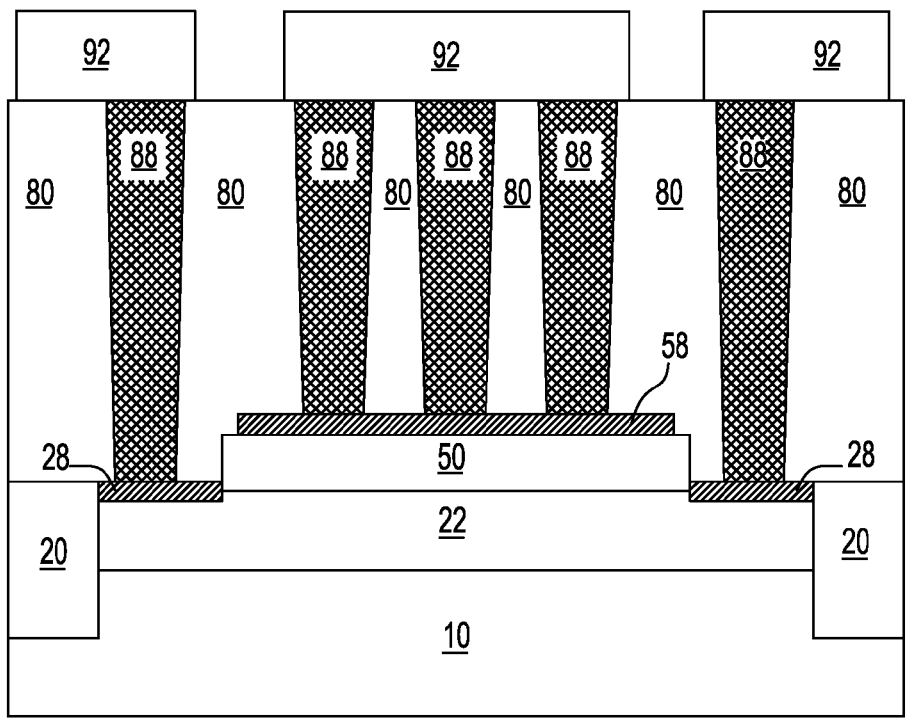

Referring to FIG. 17, a middle-of-line (MOL) dielectric 80 is formed over the semiconductor substrate 10. Contact via holes are formed in the MOL dielectric 80 and contact vias 88 are formed within the contact via holes by deposition of a metal followed by planarization. At least one wiring level metal 92 is deposited and patterned as well as corresponding at least one wiring level dielectric layers (not shown).

In the fifth exemplary structure according to the second embodiment of the present invention, the silicide alloy layer 58 comprises a first electrode of a semiconductor-insulator-silicide (SIS) capacitor, the doped single crystalline semiconductor region 22 comprises a second electrode of the SIS capacitor, and the salicide mask dielectric layer 50 comprises a capacitor dielectric of the SIS capacitor.

Figure 18:
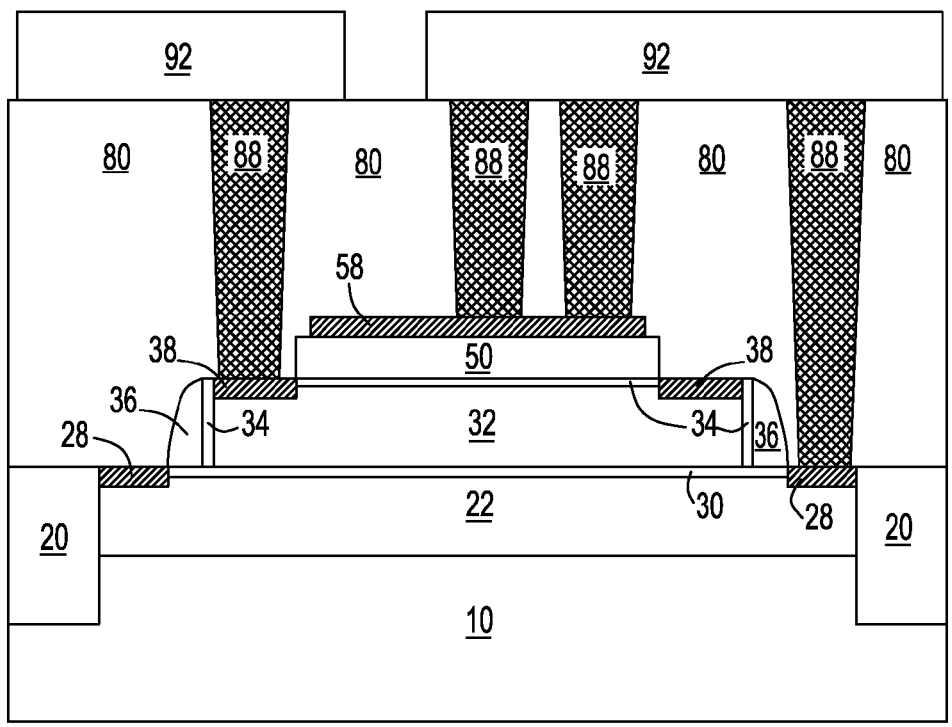
FIGS. 18-22 are vertical cross-sectional views of a sixth, a seventh, an eighth, a ninth, and a tenth exemplary structure, respectively, according to the second embodiment of the present invention.

Referring to FIG. 18, a sixth exemplary semiconductor structure according to the second embodiment of the present invention is shown. In addition to the components of the fifth exemplary structure according to the present invention, the sixth exemplary structure further comprises a gate dielectric 30 formed directly on the doped single crystalline semiconductor region 22, a first doped polycrystalline silicon containing layer 32 formed directly on the gate dielectric 30, and formed directly on the first doped polycrystalline silicon containing layer 32.

A gate spacer 36 may be disposed on the doped polycrystalline silicon containing layer 32. Preferably, the first doped polycrystalline silicon containing layer 32 is of unitary construction, i.e., in one piece. The gate spacer 36 surrounds the first doped polycrystalline silicon containing layer 32 and is topologically homeomorphic to a torus, i.e., the gate spacer 36 may be transformed into a torus by continuous stretching and bending.

Preferably, at least one gate dielectric of at least one metal-oxide-semiconductor field effect transistor (MOSFET; not shown) is also formed on the same semiconductor substrate 10 as the gate dielectric 30 in the sixth exemplary structure according to the present invention. More preferably, the at least one gate dielectric and the gate dielectric 30 in the sixth exemplary structure are formed during the same processing steps and comprise the same material.

The first doped polycrystalline silicon containing layer 32 is a doped polycrystalline material that contains silicon and may comprise doped polysilicon, doped polycrystalline silicon-germanium alloy, doped polycrystalline silicon-carbon alloy, or doped polycrystalline silicon-germanium-carbon alloy. The first doped polycrystalline silicon containing layer 32 may be doped with p-type dopants such as boron and gallium, or may be doped with n-type dopants such as phosphorus, arsenic, and antimony. Preferably, at least one gate conductor of at least one metal-oxide-semiconductor field effect transistor (MOSFET; not shown) is formed on the same semiconductor substrate 10 as the first doped polycrystalline silicon containing layer 32. More preferably, the at least one gate conductor and the first doped polycrystalline silicon containing layer 32 are formed during the same processing steps and comprise the same material.

The optional oxide layer 34 may or may not be employed in exemplary structures according to the second embodiment of the present invention. In the sixth exemplary structure shown in FIG. 18, an optional oxide layer 34 is formed directly on the first doped polycrystalline silicon containing layer 32 by deposition or by oxidation of an outer portion of the first doped polycrystalline silicon containing layer 32. The optional oxide layer 34 is formed on the surfaces of the first doped polycrystalline silicon containing layer 34 that does not contact the gate dielectric 30. Preferably, the optional oxide layer 34 comprises the same material as an oxide spacer of the at least one MOSFET, and is formed during the same processing steps as the oxide spacer of the at least one MOSFET. The thickness of the optional oxide layer 34 is in the range from about 1 nm to about 15 nm, and preferably in the range from about 3 nm to about 8 nm. The gate spacer 36 is formed on the optional oxide layer 34, preferably with the same material and during the same processing steps as gate spacers for the at least one MOSFET. The gate spacer 36 comprises a dielectric material such as silicon nitride, silicon oxide, silicon oxynitride, and low-k dielectric material.

During the manufacture of the sixth exemplary structure according to the second embodiment of the present invention, the stack of the gate dielectric 30, the first doped polycrystalline silicon containing layer 32, and the optional oxide layer 34 are formed and patterned prior to deposition of the salicide mask dielectric layer 50. The lithographic patterning of the first doped polycrystalline silicon containing layer 32 exposes a portion of the doped single crystalline semiconductor region 22 such that a semiconductor silicide 28 may be subsequently formed.

A thin silicon containing layer 52 is formed directly on the optional oxide layer 34. Thereafter, a photoresist is applied to the top surface of the thin silicon containing layer 52 and lithographically patterned. The photoresist covers a portion of the thin silicon containing layer on top of a portion of the first doped polycrystalline silicon containing layer 32 while another portion of the first doped polycrystalline silicon containing layer 32 is not covered by the photoresist. Once the photoresist is patterned, the pattern is transferred into the thin silicon containing layer and the salicide mask dielectric layer 50. After the pattern transfer, a patterned thin silicon containing layer is present underneath the patterned photoresist and the portion of the first doped polycrystalline silicon containing layer 32 that is not covered with the patterned photoresist is exposed. While this structure is not explicitly shown in a separate figure, one of ordinary skill in the art may construct the corresponding structure from those in FIGS. 3 and 13.

During the formation of silicides, a first polysilicon silicide 38 is formed directly on the first doped polycrystalline silicon containing layer 32 in addition to the silicides of the fifth exemplary structure, i.e., a semiconductor silicide 28 formed directly on the doped single crystalline semiconductor region 22, and a silicide alloy layer 58 formed from the semiconductor material in the patterned thin silicon containing layer. While structures during the formation process of the silicides in the sixth structure according to the second embodiment of the present invention is not explicitly shown in a separate figure, one of ordinary skill in the art may construct the corresponding structure from those in FIGS. 5 and 15.

In the sixth exemplary structure according to the second embodiment of the present invention, the silicide alloy layer 58 comprises a first electrode of a semiconductor-insulator-silicide (SIS) capacitor, the first doped polycrystalline silicon containing layer 32 comprises a second electrode of the SIS capacitor, and the doped single crystalline semiconductor region 22 comprises a third electrode of the SIS capacitor. The stack of the salicide mask dielectric layer 50 and the optional oxide layer 34 comprises a first capacitor dielectric between the first electrode and the second electrode of the SIS capacitor. The gate dielectric 30 comprises the second capacitor dielectric between the second electrode and the third electrode of the SIS capacitor. Optionally, the first electrode and the third electrode may be connected by a metallic conductive path, which comprises two contact vias 88 and a wiring level metal 92 in FIG. 18.

The other components in the sixth exemplary structure that are common with the fifth exemplary structure are formed by the same methods for manufacturing the fifth exemplary structure according to the second embodiment of the present invention. Other alterations in the methods of manufacturing the fifth and the sixth exemplary structures are known to a person of ordinary skill in the art.

Figure 19:
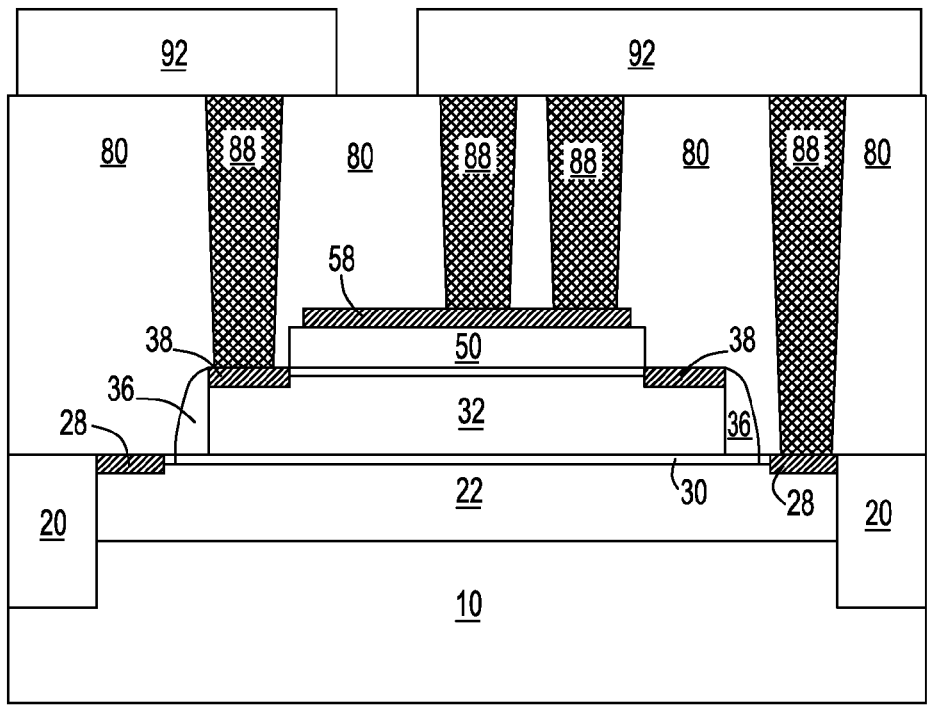

Referring to FIG. 19, a seventh exemplary semiconductor structure according to the second embodiment of the present invention is shown. The seventh exemplary semiconductor structure does not contain the optional oxide layer 34 of the sixth exemplary semiconductor structure. The manufacturing methods of the seventh exemplary structure are identical to those of the sixth exemplary structure except that the optional oxide layer 34 is not formed. Consequently, the gate spacer 36 directly contacts the first doped polycrystalline silicon containing layer 32. Similarly, the salicide mask dielectric layer 50 is formed directly on the first doped polycrystalline silicon containing layer 32. The first capacitor dielectric of the SIS capacitor in the seventh exemplary structure consists of the salicide mask dielectric layer 50, and does not contain the optional oxide layer 34.

Figure 20:
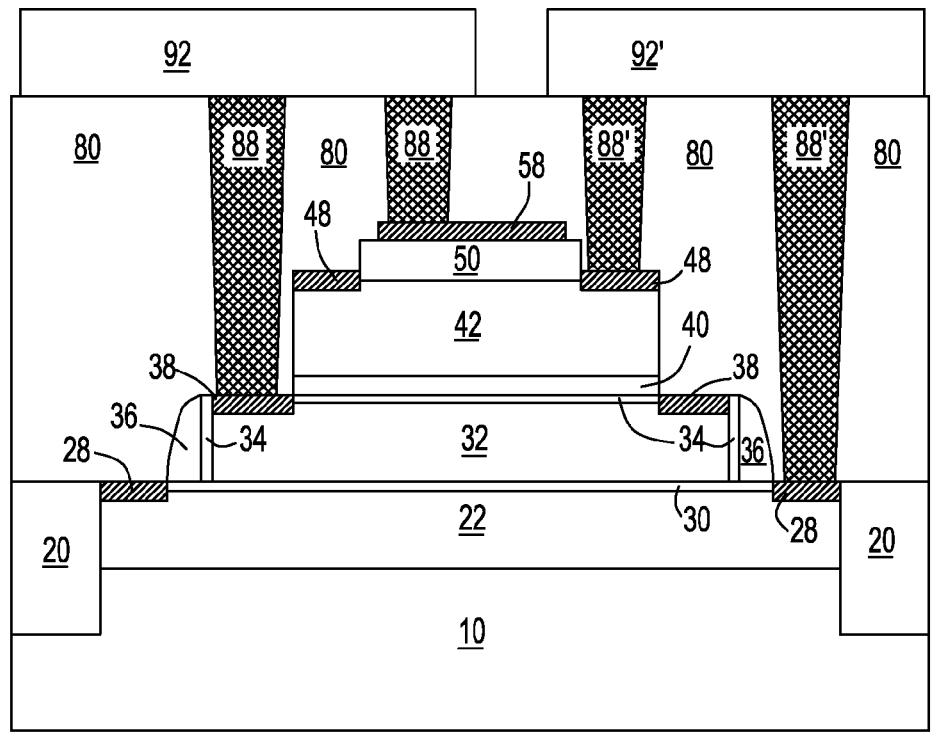

Referring to FIG. 20, an eighth exemplary structure according to the second embodiment of the present invention is shown. In addition to the components of the sixth exemplary structure, the eighth exemplary structure further comprises an insulting dielectric layer 40 formed directly on a horizontal portion of the optional oxide layer 34 and a second doped polycrystalline silicon containing layer 42 formed directly on the insulating dielectric layer 40. The stack of the insulating dielectric layer 40 and the second doped polycrystalline silicon containing layer 42 is formed and patterned prior to deposition of the salicide mask dielectric layer 50. The lithographic patterning of the stack of the insulating dielectric layer 40 and the second doped polycrystalline silicon containing layer 42 exposes a portion of the first doped polycrystalline silicon layer 34 such that a first polysilicon silicide 38 may be subsequently formed.

The insulating dielectric layer 42 may comprise silicon oxide, silicon nitride, silicon oxynitride, or a stack thereof. Preferably, the insulating dielectric layer 42 comprises the same material as a base dielectric of a bipolar transistor (not shown) and formed during the same processing steps as the base dielectric of the bipolar transistor. The base dielectric is a dielectric layer that is formed prior to the formation of an intrinsic base or extrinsic base in a bipolar transistor manufacturing process.

The second doped polycrystalline silicon containing layer 42 is a doped polycrystalline material that contains silicon and may comprise doped polysilicon, doped polycrystalline silicon-germanium alloy, doped polycrystalline silicon-carbon alloy, or doped polycrystalline silicon-germanium-carbon alloy. The second doped polycrystalline silicon containing layer 42 may be doped with p-type dopants such as boron and gallium, or may be doped with n-type dopants such as phosphorus, arsenic, and antimony. Preferably, the second doped polycrystalline silicon containing layer 42 comprises the same material as an intrinsic base, an extrinsic base, or a stack of an intrinsic base and an extrinsic base of a bipolar transistor (not shown) and formed during the same processing steps as the corresponding component the bipolar transistor.

During the manufacture of the eighth exemplary structure according to the second embodiment of the present invention, a thin silicon containing layer is formed directly on the second doped polycrystalline silicon containing layer 42. Thereafter, a photoresist is applied to the top surface of the thin silicon containing layer and lithographically patterned. The photoresist covers a portion of the thin silicon containing layer on top of a portion of the second doped polycrystalline silicon containing layer 42 while another portion of the second doped polycrystalline silicon containing layer 42 is not covered by the photoresist. Once the photoresist is patterned, the pattern is transferred into the thin silicon containing layer and the salicide mask dielectric layer 50. After the pattern transfer, a patterned thin silicon containing layer is present underneath the patterned photoresist and the portion of the second doped polycrystalline silicon containing layer 42 that is not covered with the patterned photoresist is exposed. While this structure is not explicitly shown in a separate figure, one of ordinary skill in the art may construct the corresponding structures from those in FIGS. 9 and 13.

During the formation of silicides, a second polysilicon silicide 48 is formed directly on the second doped polycrystalline silicon containing layer 42 in addition to the silicides of the sixth exemplary structure, i.e., a semiconductor silicide 28 formed directly on the doped single crystalline semiconductor region 22, a first polysilicon silicide 38 formed directly on the first doped polycrystalline silicon containing layer 32, and a silicide alloy layer 58 formed from the semiconductor material in the patterned thin silicon containing layer. While this structure is not explicitly shown in a separate figure, one of ordinary skill in the art may construct the corresponding structure from those in FIGS. 9 and 15.

In the eighth exemplary structure according to the second embodiment of the present invention, the silicide alloy layer 58 comprises a first electrode of a semiconductor-insulator-silicide (SIS) capacitor, the second doped polycrystalline silicon containing layer 42 comprises a second electrode of the SIS capacitor, the first doped polycrystalline silicon containing layer 32 comprises a third electrode of the SIS capacitor, and the doped single crystalline semiconductor region 22 comprises a fourth electrode of the SIS capacitor. The salicide mask dielectric layer 50 comprises a first capacitor dielectric between the first electrode and the second electrode of the SIS capacitor. The stack of the insulating dielectric layer 40 and the optional oxide layer 34 comprises the second capacitor dielectric between the second electrode and the third electrode of the SIS capacitor. The gate dielectric 30 comprises the third capacitor dielectric between the third electrode and the fourth electrode. Optionally, the first electrode and the third electrode may be connected by a first metallic conductive path, which comprises two first contact vias 88 and a first wiring level metal 92 in FIG. 20. Also optionally, the third electrode and the fourth electrode may be connected by a second metallic conductive path, which comprises two second contact vias 88' and a second wiring level metal 92' in FIG. 20.

The other components of the eighth exemplary structure that are common with the sixth exemplary structure are formed by the same methods for manufacturing the sixth exemplary structure according to the second embodiment of the present invention. Other alterations in the methods of manufacturing the sixth and the eighth exemplary structures are known to a person of ordinary skill in the art.

Figure 21:
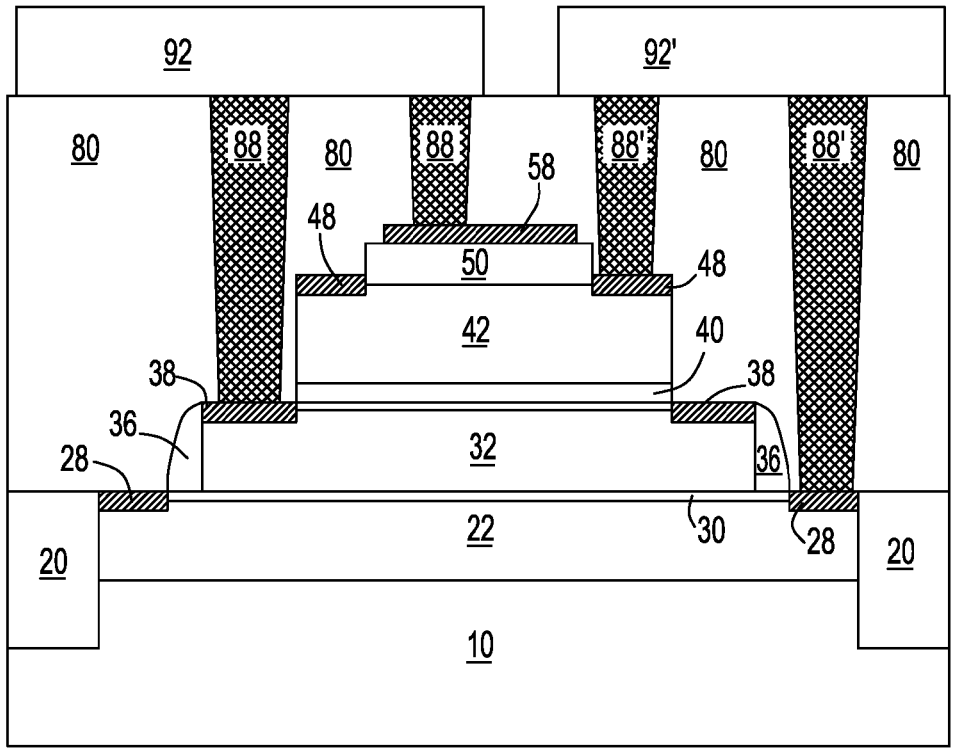

Referring to FIG. 21, a ninth exemplary semiconductor structure according to the second embodiment of the present invention is shown. The ninth exemplary semiconductor structure does not contain the optional oxide layer 34 of the eighth exemplary semiconductor structure. The manufacturing methods of the ninth exemplary structure are identical to those of the eighth exemplary structure except that the optional oxide layer 34 is not formed. Consequently, the gate spacer 36 directly contacts the first doped polycrystalline silicon containing layer 32. Similarly, the insulating dielectric layer 40 is formed directly on the first doped polycrystalline silicon containing layer 32. The second capacitor dielectric of the SIS capacitor in the ninth exemplary structure consists of the insulting dielectric layer 40 and does not contain the optional oxide layer 34.

Figure 22:
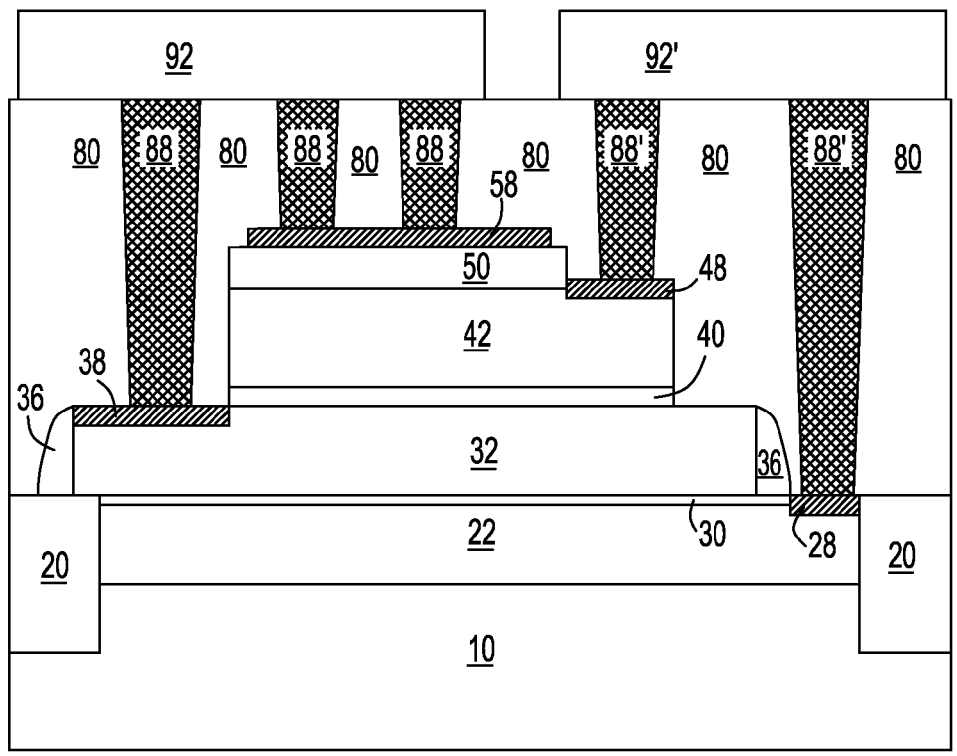

Referring to FIG. 22, a tenth exemplary structure according to the second embodiment of the present invention is shown. While the tenth exemplary structure has identical set of components as the ninth exemplary structure, the electrodes are placed asymmetrically in the tenth exemplary structure. Specifically, a first doped polycrystalline silicon containing layer 32, which is a third electrode, is located off-centered on the doped single crystalline semiconductor region 22, which is a fourth electrode. The second doped polycrystalline silicon containing layer 42, which is a second electrode, is located off-centered on the first doped polycrystalline silicon containing layer 32. The silicide alloy layer 58, which is the first electrode, is located off-centered on the second doped polycrystalline silicon containing layer 42. A first metallic conductive path, which electrically connects the first electrode and the third electrode, comprises three first contact vias 88 and a first wiring level metal 92 in FIG. 22. The tenth exemplary structure illustrates flexibility of alterations in the design of the SIS capacitor structures according to the present invention.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of manufacturing a semiconductor structure comprising:
    forming a doped single crystalline semiconductor region in a semiconductor substrate;
    forming a patterned stack of a salicide mask dielectric layer and a thin silicon containing layer on said semiconductor substrate;
    metallizing said thin silicon containing layer to form a suicide alloy layer directly on said salicide mask dielectric layer;
    forming a semiconductor silicide directly on said doped single crystalline semiconductor region;
    forming a gate dielectric directly on said doped single crystalline semiconductor region;
    forming a first doped polycrystalline silicon containing layer directly on said gate dielectric prior to forming said salicide mask dielectric layer;
    forming a first polysilicon silicide directly on said first doped polycrystalline silicon containing layer;
    forming an isolation dielectric layer on said first doped polycrystalline silicon containing layer;
    forming a second doped polycrystalline silicon containing layer directly on said isolation dielectric layer prior to forming said salicide mask dielectric layer; and
    forming a second polysilicon suicide directly on said second doped polycrystalline silicon containing layer.

2. A method of manufacturing a semiconductor structure, comprising:
    forming a doped single crystalline semiconductor region in a semiconductor substrate;
    forming a patterned stack of a salicide mask dielectric layer and a thin silicon containing layer on said semiconductor substrate;
    metallizing said thin silicon containing layer to form a suicide alloy layer directly on said salicide mask dielectric layer;

forming a semiconductor silicide directly on said doped single crystalline semiconductor region;

forming a gate dielectric directly on said doped single crystalline semiconductor region;

forming a first doped polycrystalline silicon containing layer directly on said gate dielectric prior to forming said salicide mask dielectric layer;

forming a first polysilicon silicide directly on said first doped polycrystalline silicon containing layer;

forming an isolation dielectric layer on said first doped polycrystalline silicon containing layer; and forming a second doped polycrystalline silicon containing layer directly on said isolation dielectric layer prior to forming said salicide mask dielectric layer.

3. A method of manufacturing a semiconductor structure, comprising:

forming a doped single crystalline semiconductor region in a semiconductor substrate;

forming a gate dielectric directly on said doped single crystalline semiconductor region;

forming a first doped polycrystalline silicon containing layer directly on said gate dielectric;

forming an isolation dielectric layer on said first doped polycrystalline silicon containing layer;

forming a second doped polycrystalline silicon containing layer directly on said isolation dielectric layer;

forming a patterned stack of a salicide mask dielectric layer and a thin silicon containing layer on said semiconductor substrate;

metallizing said thin silicon containing layer to form a suicide alloy layer directly on said salicide mask dielectric layer;

forming a semiconductor suicide directly on said doped single crystalline semiconductor region; and forming a first polysilicon silicide directly on said first doped polycrystalline silicon containing layer.

* * * * *